US010998865B2

(12) United States Patent
Braun et al.

(10) Patent No.: US 10,998,865 B2
(45) Date of Patent: *May 4, 2021

(54) METHODS AND APPARATUSES FOR DIGITAL PRE-DISTORTION

(71) Applicant: CommScope Technologies LLC, Hickory, NC (US)

(72) Inventors: Patrick Braun, Munningen (DE); Joerg Stefanik, Donauworth (DE); Mohammed Dokni, Neusäss (DE); Peter Schmid, Marxheim-Neuhausen (DE); Rainer Friedrich, Maihingen (DE)

(73) Assignee: CommScope Technologies LLC, Hickory, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 16/799,018

(22) Filed: Feb. 24, 2020

(65) Prior Publication Data
US 2020/0195203 A1 Jun. 18, 2020

Related U.S. Application Data

(63) Continuation of application No. 16/050,740, filed on Jul. 31, 2018, now Pat. No. 10,615,754.
(Continued)

(51) Int. Cl.
H04B 1/04 (2006.01)
H03F 1/32 (2006.01)
(Continued)

(52) U.S. Cl.
CPC .......... *H03F 1/3247* (2013.01); *H03F 3/189* (2013.01); *H03F 3/24* (2013.01); *H03F 3/72* (2013.01);
(Continued)

(58) Field of Classification Search
CPC ...... H04B 1/04; H04B 1/0475; H04B 1/0489; H03F 1/32; H03F 3/19; H03F 3/24;
(Continued)

(56) References Cited

U.S. PATENT DOCUMENTS 7,058,369 B1 6/2006 Wright et al.
2006/0040624 A1 2/2006 Lipka
(Continued)

OTHER PUBLICATIONS

International Searching Authority, "International Search Report and Written Opinion from PCT Application No. PCT/US2018/044585 dated Nov. 5, 2018", from Foreign Counterpart to U.S. Appl. No. 16/050,740, filed Nov. 5, 2018, pp. 1-14, Published: KR.
(Continued)

*Primary Examiner* — Blane J Jackson
(74) *Attorney, Agent, or Firm* — Fogg & Powers LLC

(57) ABSTRACT

A method is provided. The method, comprises: power amplifying, with at least two parallel power amplifiers, at least two pre-distorted signals each corresponding to a unique transmit band, wherein each power amplifier operates in a unique transmit band; and pre-distorting, with a single pre-distortion system, at least two signals in different transmit bands, where the pre-distortion of each of the at least two signals is based upon a portion of a corresponding power amplified, pre-distorted signal, and where the pre-distortion diminishes certain IMD products in the corresponding power amplified, pre-distorted signal.

9 Claims, 8 Drawing Sheets

Related U.S. Application Data

(60) Provisional application No. 62/543,453, filed on Aug. 10, 2017.

(51) Int. Cl.
| | |
|---|---|
| *H03F 3/72* | (2006.01) |
| *H03F 3/189* | (2006.01) |
| *H03F 3/24* | (2006.01) |
| *H04B 1/00* | (2006.01) |
| *H04L 27/36* | (2006.01) |
| *H04J 3/04* | (2006.01) |

(52) U.S. Cl.
CPC ......... *H04B 1/0028* (2013.01); *H04B 1/0475* (2013.01); *H04L 27/367* (2013.01); *H03F 2200/111* (2013.01); *H03F 2203/7209* (2013.01); *H04B 2001/0425* (2013.01); *H04J 3/047* (2013.01)

(58) Field of Classification Search
CPC . H03F 3/32; H03F 3/72; H03F 1/3241; H03F 1/3247; H03F 1/3282
See application file for complete search history.

(56) References Cited

U.S. PATENT DOCUMENTS

| | | |
|---|---|---|
| 2009/0184763 A1 | 7/2009 | Kim |
| 2012/0200355 A1 | 8/2012 | Braithwaite |
| 2012/0294201 A1 | 11/2012 | Kurokawa et al. |
| 2013/0004180 A1 | 1/2013 | Gupta et al. |
| 2013/0094550 A1 | 4/2013 | Coan et al. |
| 2015/0049841 A1 | 2/2015 | Laporte et al. |
| 2016/0105299 A1 | 4/2016 | Chee et al. |
| 2016/0156375 A1 | 6/2016 | Yang et al. |
| 2016/0261294 A1 | 9/2016 | Kim et al. |
| 2017/0201275 A1 | 7/2017 | Tabatabai et al. |

OTHER PUBLICATIONS

Pehlke et al. "LTE-Advanced Pro RF Front-End Implementations to Meet Emerging Carrier Aggregation and DL MIMO Requirements," from "IEEE Communications Magazine", Apr. 2017, pp. 134-141.
U.S. Patent and Trademark Office, "Advisory Action", U.S. Appl. No. 16/050,740, dated Oct. 9, 2019, pp. 1-3, Published: US.
U.S. Patent and Trademark Office, "Final Office Action", U.S. Appl. No. 16/050,740, dated Aug. 1, 2019, pp. 1-9, Published: US.
U.S. Patent and Trademark Office, "Notice of Allowance", U.S. Appl. No. 16/050,740, dated Dec. 9, 2019, pp. 1-14, Published: US.
U.S. Patent and Trademark Office, "Office Action", U.S. Appl. No. 16/050,740, dated Apr. 25, 2019, pp. 1-16, Published: US.

METHODS AND APPARATUSES FOR DIGITAL PRE-DISTORTION

CROSS-REFERENCE TO RELATED APPLICATIONS

The present application is a continuation of U.S. patent application Ser. No. 16/050,740, filed Jul. 31, 2018, which claims benefit of U.S. Patent Application Ser. No. 62/543,453, filed Aug. 10, 2017; the entire contents of the aforementioned patent applications are incorporated herein by reference as if set forth in their entirety.

BACKGROUND

A repeater system (such as a distributed antenna system (DAS) or a single-node repeater) is typically used to improve the wireless radio frequency (RF) coverage provided by one or more base stations. The wireless service provided by each base station can include commercial cellular service or private or public safety wireless service. The repeater system can be implemented as an "active" system in the sense that the downlink and uplink RF signals are amplified before being repeated.

Active repeater systems can be used, for example, in sport stadiums, buildings (hotels, malls, or trade centers), metro stations and airports, trains, and tunnels. Each base station can be coupled to the repeater system via one or more cables or via a wireless connection, for example, using one or more donor antennas. Repeater systems can be used in other applications.

The capacity of each base station coupled to a repeater system can be dedicated to the repeater system. The capacity of each base station coupled to a repeater system can also be shared among the repeater system and a base station antenna system that is co-located with the base station and/or shared among the repeater system and one or more other repeater systems.

Active repeater systems typically suffer from intermodulation distortion. For example, to obtain higher power added efficiency, power amplifiers in such systems are operated at saturation, that is, in a non-linear region. As a result, two or more radio carriers, e.g., in a downlink band, may be amplitude modulated and create an undesired intermodulation distortion (IMD) product. IMD products can create adjacent channel interference. If IMD product(s) fall within a receive band, sensitivity and dynamic range of the receiver in the base station can be reduced.

If the receiver in the base station is able to receive signals with increased sensitivity, it can receive weaker signals, which can be used to increase the reception range and overall coverage area of the base station and the associated repeater system. This can result in cost savings as fewer base stations and repeater systems (or components thereof such as DAS remote units) may be required to provide the desired wireless coverage and capacity.

Digital pre-distortion (DPD) is used to diminish IMD products at the output of a power amplifier. An exemplary technique for digital pre-distortion is illustrated in US patent publication US20120200355 A1 (the '355 Publication), which is incorporated herein in its entirety. The '355 Publication discloses the use of a coupler to feedback a portion of an output signal from a power amplifier. The output of the coupler is provided to a RF to digital converter which down converts and digitizes the feedback signal to a coefficient estimator. The coefficient estimator supplies coefficients to a digital pre-distortion module that generates tones of appropriate phase and amplitude to diminish IMD products, such as third order IMD products, at the output of the power amplifier.

Digital pre-distortion circuitry adds cost to the systems in which it is used. For broadband DASs and single-node repeaters, two or more power amplifiers may be needed to cover different RF transmit bands. Typically, each power amplifier is preceded by its own DPD circuitry. This undesirably increases system cost.

SUMMARY OF THE INVENTION

A method is provided. The method, comprises: power amplifying, with at least two parallel power amplifiers, at least two pre-distorted signals each corresponding to a unique transmit band, wherein each power amplifier operates in a unique transmit band; and pre-distorting, with a single pre-distortion system, at least two signals in different transmit bands, where the pre-distortion of each of the at least two signals is based upon a portion of a corresponding power amplified, pre-distorted signal, and where the pre-distortion diminishes certain IMD products in the corresponding power amplified, pre-distorted signal.

DRAWINGS

Understanding that the drawings depict only exemplary embodiments and are not therefore to be considered limiting in scope, the exemplary embodiments will be described with additional specificity and detail through the use of the accompanying drawings, in which.

Figure 6A:
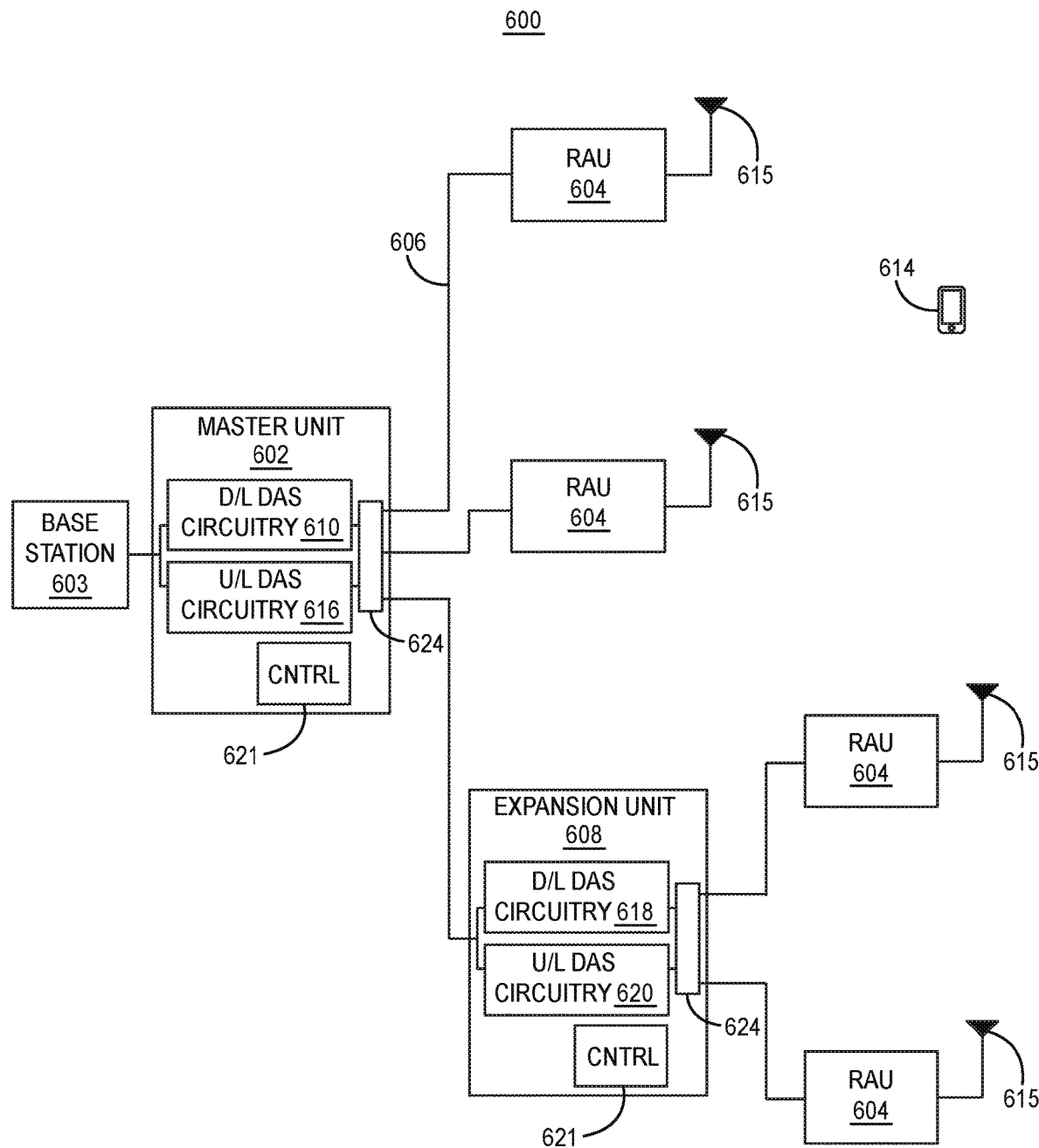
Figure 6B:
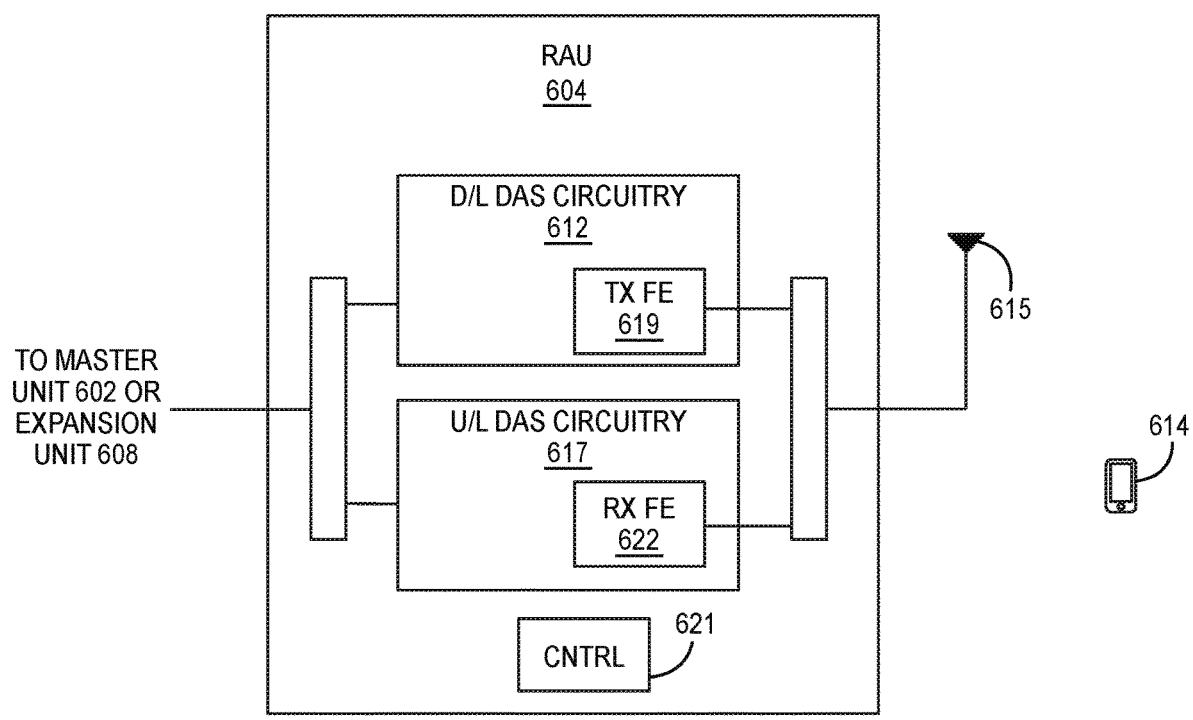
Figure 7:
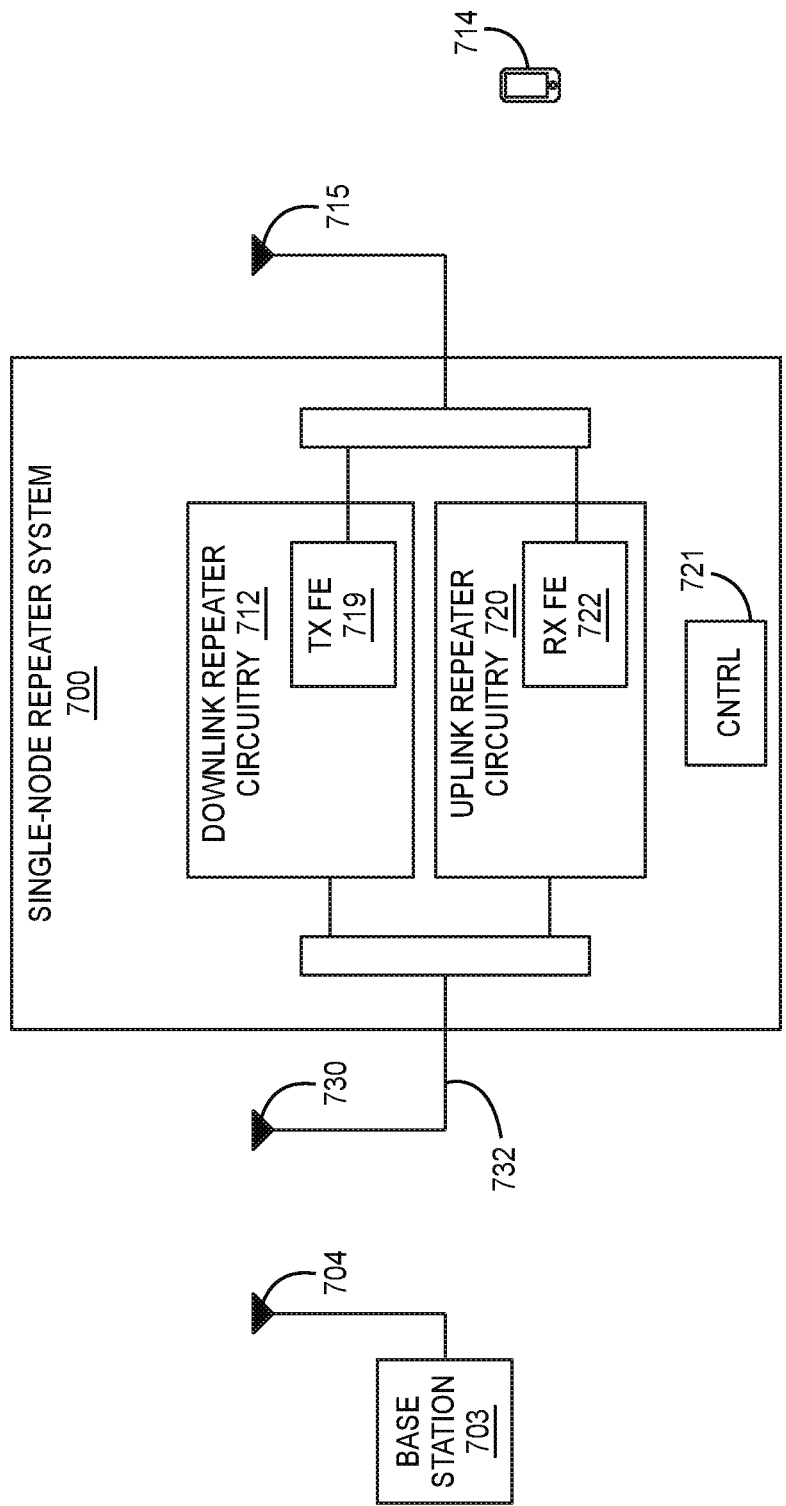

FIG. 6A illustrated one embodiment of a distributed antenna system in which digital pre-distortion techniques can be implemented;

FIG. 6B illustrates one embodiment of a remote antenna unit in which digital pre-distortion techniques can be implemented; and FIG. 7 illustrates one embodiment of a single-node repeater in which digital pre-distortion techniques can be implemented.

DETAILED DESCRIPTION

Embodiments described below provide techniques for reducing the cost of frequency division duplexing and/or time division duplexing repeater systems using digital pre-distortion circuitry. Such repeater systems are used in cellular networks (such as LTE networks), DASs and off-air repeaters. As will be subsequently further described, the techniques include those that disclose how to reduce the number of digital pre-distortion circuitry and data converters in such repeater systems, and how to facilitate the use of lower cost multiplexers that combine and separate signals of uplink and downlink bands, e.g. when employing frequency division duplexing. These techniques desirably reduce system cost. Although subsequently illustrated for use in repeater systems, embodiments of the invention may be applicable to other types of communications systems.

For pedagogical reasons, multiplexers may be hereafter referred to as duplexers which filter/combine two bands. However, the embodiments exemplified with duplexers are applicable to multiplexers which can filter/combine two or more bands.

Figure 1:
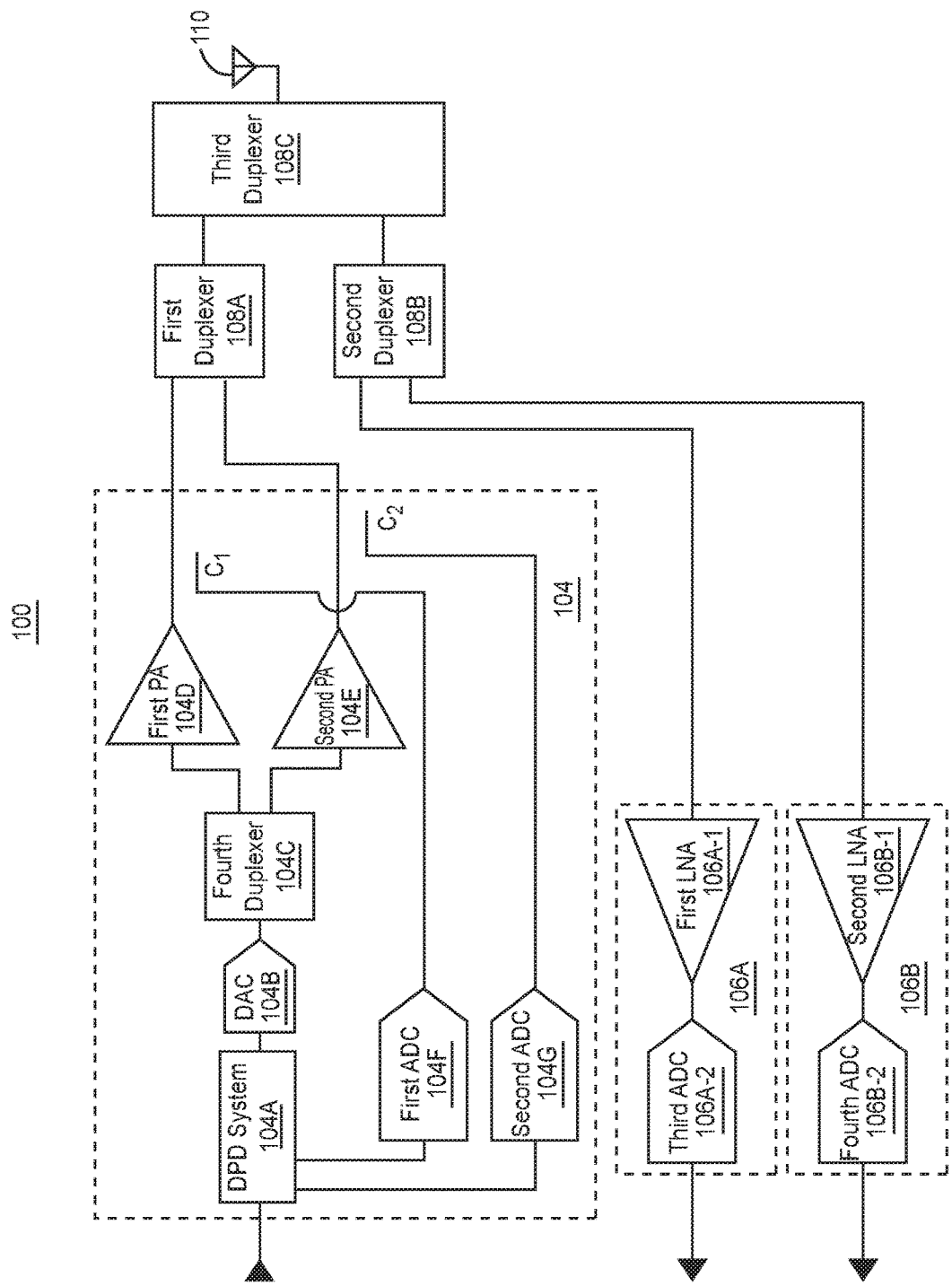
FIG. 1 illustrates a block diagram of one embodiment of a multi-band front end system.

FIG. 1 illustrates a block diagram of one embodiment of a multi-band front end system 100. The illustrated multi-band front end system 100 has the benefit of reducing the number of digital pre-distortion circuitry used per power amplifier. Each power amplifier operates in a different transmit band. For frequency domain duplexing operation, this transmit band is a downlink band. For time domain duplexing, the frequency range for a transmit band is also the frequency range of a corresponding receive band.

For pedagogical reasons, FIG. 1 illustrates a multi-band front end system 100 configured to transmit and receive on different, e.g. two, transmit bands. The illustrated multi-band front system 100 includes a transmitter front end 104 including a first power amplifier 104D and a second power amplifier 104E, and a first receiver front end 106A and a second receiver front end 106B.

Additional circuitry can be added to facilitate operation on additional transmit and receive band(s). For example, two or more transmitter front end systems can be used; as a result, additional, e.g. three or more, receiver front end systems may also be required.

Alternatively, a transmitter front end system 104 may include three or more power amplifiers. Thus, for example, for three power amplifiers in the transmitter front end system 104, the illustrated fourth duplexer 104C would be replaced by a triplexer. A third power amplifier would be coupled to the output of the triplexer. Further, an additional coupler and analog to digital converter (ADC) would be added between the output of an additional third power amplifier and a DPD system 104A. The third power amplifier, and the additional coupler and ADC would be added in a manner analogous as shown in FIG. 1.

The illustrated multi-band front end system 100 includes a transmitter front end system 104, a first receiver front end system 106A, a second receiver front end system 106B, a first duplexer 108A, a second duplexer 108B, a third duplexer 108C, and an antenna 110. An input of the transmitter front end system 104 is configured to receive digital baseband data or pulse code modulated (i.e. digitized) radio frequency (RF) signals, e.g. from one or more base stations. Outputs of the first receiver front end system 106A and the second receiver front end system 106B are respectively configured to provide, e.g. digital baseband data or digitized modulated RF signals.

In the illustrated embodiment, the transmitter front end system 104 is configured to receive signals corresponding to the two transmit bands. In another embodiment, the transmitter bands of the transmitter front end system 104 are widely separated so that the low order intermodulation distortion (IMD) products and harmonics from one transmitter band do not fall within another transmitter band. In a further embodiment, each of the first receiver front end system 106A and the second receiver front end system 106B are configured to operate in, and provide digitized RF signals, in separate receive bands. For frequency division duplexing, the frequency range of the receive band, the uplink band, is different from the frequency range of the transmit band, the downlink band. For time division duplexing, frequency range of the receive band is the same as the frequency range of the transmit band. In yet another embodiment, the transmit and receive bands are LTE transmit and receive bands.

The transmitter front end system 104 and the two receiver front end systems are respectively configured to (a) receive digital baseband data or digitized RF signals, and (b) provide digital baseband data or digitized RF signals. If digital baseband data is provided to and received by respectively the transmitter front end system 104, the first receiver front end system 106A, and the second receiver front end system 106B, then the transmitter front end system 104, the first receiver front end system 106A, and the second receiver front end system 106B must be configured to up convert and down convert transmit and receive signals as will be subsequently described.

In the illustrated embodiment, two outputs, respectively corresponding to a first transmit band and a second transmit band, of the transmitter front end system 104 are coupled to first and second ports of a first duplexer 108A. An input of the first receiver front end system 106A and an input of the second receiver front end system 106B are respectively coupled to first and second ports of a second duplexer 108B. First and second ports of a third duplexer 108C are coupled to third ports of the first duplexer 108A and the second duplexer 108B. An antenna 110 is coupled to the third port of the third duplexer 108C.

In one embodiment, the first duplexer 108A, the second duplexer 108B, and/or third duplexer 108C are cavity duplexers. In alternative embodiments, the first duplexer 108A, the second duplexer 108B, and/or third duplexer 108C are ceramic duplexers or thin-film bulk acoustic resonators (FBARs).

Implementations, other than those illustrated in FIG. 1, may be used to couple one or more antennas to the output of the transmitter front end system 104, and the inputs of the first receiver front end system 106A and the second receiver front end system 106B. For example, the third duplexer 108c and a fifth duplexer could each couple respectively (a) a first port of a first coupler $C_1$ and the input of first receiver front end system 106A to a first antenna, and (b) a first port of a second coupler $C_2$ and the input of second receiver front end system 106B to a second antenna.

One embodiment of the transmitter front end system 104 will now be described. The illustrated transmitter front end system 104 comprises the DPD system 104A, a digital to analog converter (DAC) 104B, a fourth duplexer 104C, a first power amplifier (PA) 104D, a second power amplifier 104E, the first coupler $C_1$, the second coupler $C_2$, a first analog to digital converter (ADC) 104F, and a second ADC 104G. The input of the DPD system 104A is configured to receive digital baseband data or digitized RF signals. In the illustrated embodiment, the first ports of the first coupler $C_1$ and the second coupler $C_2$ are respectively coupled to the first and second ports of the first duplexer 108A. In another embodiment, each power amplifier is a monolithic microwave integrated circuit.

The DPD system 104A modifies signals (which it receives and which correspond to the two transmit bands) to diminish IMD products, typically up to a finite order (e.g. all third and fifth order IMD products). In one embodiment, the diminished IMD products fall within uplink or receive bands of the multi-band front end system 100, therefore only negligibly decreasing the sensitivity of the multi-band front end system 100 in those uplink bands. By negligibly decreasing the sensitivity, the reception range of the repeater system (incorporating the multi-band front end system 100) is only negligibly diminished. In another embodiment, the DPD system 104A generates signals that diminish, e.g. cancel, such IMD products.

In one embodiment, the transmitter front end system 104 is configured to receive digital baseband data. In such a case, for example, the DPD system 104A would modify the digital baseband data to diminish the IMD products in each digitized RF signal at the output of each power amplifier. For example, for this case, the DPD system 104A could be implemented with the DPD module and coefficient estimator described in the '355 Publication. Further, the DAC 104B would include an up converter, e.g. digital up converter proceeding the digital to analog conversion; the first ADC 104F and the second ADC 104G could each include a down converter, e.g. a digital down converter following the analog to digital conversion. The DPD system 104A embodies one or more digital pre-distortion circuits to pre-distort signals corresponding to at least two distinct bands; however, the DPD system 104A is implemented in a single device, e.g. such as the devices illustrated below.

In an alternative embodiment, the transmitter front end system 104 is configured to receive a digitized RF signal modulated with data. The DPD system 104A would be similarly implemented but would modify the digitized RF signal, e.g. adding RF tones of appropriate amplitude and phase, to suppress the IMD products. The DAC and ADCs would not require respectively an up converter and a down converter. To facilitate data processing, the data rate and bit rate are respectively reduced to reduce bandwidth (when analog to digital conversion is performed. For pedagogical reasons, FIG. 1 will be subsequently described assuming RF signals are provided to the DPD system 104A.

In one embodiment, the DPD system 104A is implemented in any state machine such as a field programmable gate array, a processor such as a digital signal processor (DSP), or an application specific integrated circuit (ASIC). The state machine may be coupled to memory, such as programmable read only memory and/or flash memory. In a further embodiment, the DPD system 104A can be implemented in a processing system of another component of the repeater system.

The DPD system 104A is coupled to an input of the DAC 104B. The DAC 104B converts the pre-distorted digitized RF signal, generated from the DPD system 104A, to an analog signal. A first port of the fourth duplexer 104C is coupled to the output of the DAC 104B. The fourth duplexer 104C filters signals in the first transmit band so that they are provided at a second port of the fourth duplexer 104C, and signals in the second transmit band so that they are provided at a third port of the fourth duplexer 104C. In one embodiment, the fourth duplexer 104C is implemented with a ceramic or FBAR duplexer; alternatively, the fourth duplexer 104C is implemented with a cavity duplexer.

The second and third ports of the fourth duplexer 104C are respectively coupled to inputs of the first power amplifier 104D and the second power amplifier 104E. Typically, the first power amplifier 104D is designed to provide high efficiency power amplification of signals in the first transmit band. The second power amplifier 104E is designed to provide high efficiency power amplification of signals in the second transmit band. As previously discussed, the first power amplifier 104D and the second power amplifier 104E are operated near saturation. Further, the first power amplifier 104D and the second power amplifier 104E are coupled in parallel with respect to one another in the illustrated multi-band front end system 100; alternatively, the first power amplifier 104D and the second power amplifier 104E are referred to as a parallel first power amplifier 104D and second power amplifier 104E.

Second ports of the first coupler $C_1$ and the second coupler $C_2$ are respectively coupled to the outputs of the first power amplifier 104D and the second power amplifier 104E. The third ports of the first coupler $C_1$ and the second coupler $C_2$ are respectively coupled to the inputs of the first ADC 104F and the second ADC 104G. The first ADC 104F and the second ADC 104G generate digitized signals from the analog signals coupled from the first coupler $C_1$ and the second coupler $C_2$. Each having a coupling factor sufficient to provide signals of sufficient power level for the first ADC 104F and the second ADC 104G to generate corresponding digitized signals. In one embodiment, the first coupler $C_1$ and the second coupler $C_2$ are directional couplers.

The outputs of the first ADC 104F and the second ADC 104G are coupled to the DPD system 104A. The DPD system 104A is configured to receive the digitized signals generated by the first ADC 104F and the second ADC 104G and use them to modify the digital baseband data or digitized RF signals so as to diminish IMD products at the output of the first power amplifier 104D and the second power amplifier 104E. In one embodiment, the digitized signals generated by the first ADC 104F and the second ADC 104G are used to generate frequency components having certain amplitudes and phases necessary to diminish the IMD products.

In the illustrated embodiment, the first receiver front end system 106A and the second receiver front end system 106B respectively operate in a first receive band and a second receive band. The first receiver front end system 106A comprises a first low noise amplifier (LNA) 106A-1 having an output coupled to an input of a third ADC 106A-2. The second receiver front end system 106B comprises a second low noise amplifier (LNA) 106B-1 having an output coupled to an input of a fourth ADC 106B-2. In another embodiment, each low noise amplifier is a monolithic microwave integrated circuit.

Operation of the multi-band front end system 100 will now be summarized. The DPD system 104 is configured to receive digitized RF signals for two separate transmit bands. The DPD system 104 modifies, by pre-distortion, such RF signals, e.g. by adding tones of appropriate amplitude and phase, to diminish IMD products up to a certain order. IMD products are generated symmetrically around the center frequency of each transmit band. Because the power levels of higher order IMD products are typically lower than the power levels of lower IMD products, it is only practically necessary to diminish IMD products up to a certain order, e.g. third, fifth or seventh order.

The pre-distorted RF signals of each transmit band are converted to analog signals by the DAC 104B. The analog pre-distorted RF signals of each transmit band are filtered, and thus separated by the fourth duplexer 104C. The first power amplifier 104D is configured to receive and power amplify analog pre-distorted RF signals in the first transmit band. The second power amplifier 104E is configure to receive and power amplify analog pre-distorted RF signals in the second transmit band. Because of the pre-distortion, the power amplified RF signals, in the first and second transmit bands and provided at the outputs of each of the first power amplifier 104D and the second power amplifier 104E, have diminished IMD products up to the order that the DPD system 104A is designed to diminish.

The first coupler $C_1$ and the second coupler $C_2$ feedback a portion of the power amplified RF signals in the first and second transmit bands respectively to the first ADC 104F and the second ADC 104G. The first ADC 104F and the second ADC 104G which digitize the feedback portions of the power amplified RF signals respectively in the first and second transmit bands. The DPD system 104A is configured to receive the digitized feedback portions of the power amplified RF signals respectively in the first and second transmit bands so as to adjust the amplitude and phase of the added tones to enhance the suppression of IMD products.

The antenna 110 is configured to transmit and receive signals on both sets of transmit and receive bands, e.g. a first band and a second band. For a frequency division duplexing, the first band includes the first downlink band and the first uplink band; the second band includes the second downlink band and the second uplink band. However, if one of the bands is configured to operate using time division duplexing, the transmit band and the receive band are a single band, i.e. a transmit band and a receive band having the same frequency range, over which signals are transmitted and received.

For frequency division duplexing, the first duplexer 108A isolates the signals amplified by the first power amplifier 104D and the second power amplifier 104E. For frequency division duplexing, the second duplexer 108B isolates, e.g. local oscillator signal leakage from, the first receiver front end system 106A and the second receiver front end 106B. The third duplexer 108c isolates the first receiver front end system 106A and the second receiver front end system 106B by filtering, or diminishing the amplitude of, signals in the first and second transmit bands emitted by the transmitter front end system 104; this allows avoidance of a reduction of sensitivity in the uplink bands of the receiver of the multi-band front end system 100.

The RF signals modulated with data in the first uplink band are coupled from the antenna 110, the third duplexer 108c, and the second duplexer 108B to the first receiver front end system 106A. A first low noise amplifier 106A-1 is configured to amplify with diminished, e.g. optimized, additive noise so as to diminish, e.g. optimize, the noise figure in the first uplink band of the receiver of the multiband front end system 100. The third ADC 106A-2 digitizes the amplified RF signals in the first receive band.

The RF signals modulated with data in the second uplink band are coupled from the antenna 110, the third duplexer 108c, and the second duplexer 108B to the second receiver front end system 106B. The second low noise amplifier 106B-1 is configured to amplify with diminished, e.g. optimized, additive noise so as to diminish, e.g. optimize, the noise figure in the first uplink band of the receiver of the multi-band front end system 100. The fourth ADC 106B-2 digitizes the amplified RF signals in the first receive band.

As discussed above, the third duplexer 108C diminishes emissions, in the first and the second receive bands, from the transmitter front end system 104 leaking into the first and second receiver front end systems 106A, 106B. A relatively high isolation, e.g. 120 dB, can be required between the corresponding transmit and receive bands of a duplexer to suppress IMD products (generated in the transmitter front end system 104 and having frequencies in the first and/or second uplink bands) from undesirably diminishing receiver sensitivity. Very high isolation duplexers are expensive, increasing system cost. Lower performance, and thus lower cost, duplexers can be used by modifying the operation of the DPD system 104A as described below.

Transmission and reception respectively over corresponding downlink and uplink bands is referred to as frequency division duplexing. Typically, for each downlink band, the DPD system 104A is designed to diminish IMD products across a bandwidth (or DPD correction bandwidth) that is centered on the center frequency of the downlink band.

Figure 2A:
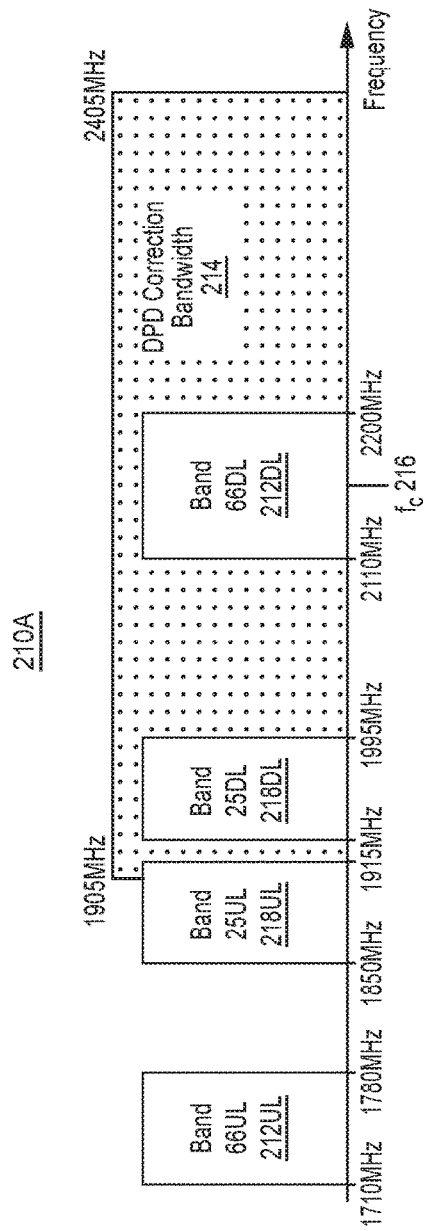
FIG. 2A illustrates one embodiment of a DPD correction bandwidth.

FIG. 2A illustrates one embodiment of a DPD correction bandwidth 210A. The illustrated downlink band is downlink band (DL Band) 66 212DL. The DPD correction bandwidth 214 has a center frequency ($f_c$) 216 of 2155 MHz that is equal to the center frequency of the downlink band 66 212DL. However, unlike illustrated DL Band 25 218DL and UL Band 25 218UL, DL Band 66 212DL and UL Band 66 212UL are not proximate. As a result, UL Band 66 212UL and part of the UL band 25 are outside of the DPD correction bandwidth 214.

This is undesirable, because higher order IMD products, generated in a DL Band 66 212DL in by the transmitter front end system 104 and possibly having a detrimental level, fall within UL Band 66 212UL, and can diminish reception sensitivity of the multi-band front end system 100 in that uplink band 66 and a respective part of the uplink band 25. Although the bandwidth of the DPD correction bandwidth 214 could be increased to cover the corresponding uplink bands, this would require the DPD system to diminish more IMD products, and thus require greater processing power which undesirably increases system complexity and cost. Alternatively, the third duplexer 108C could be implemented higher isolation between ports one and three (respectively coupled to the transmitter front end system 104, and the first receiver front end system 106A or the second receiver front end system 106B) to diminish higher order IMD products. However, as discussed above, this alternative also undesirably increases system cost.

Figure 2B:
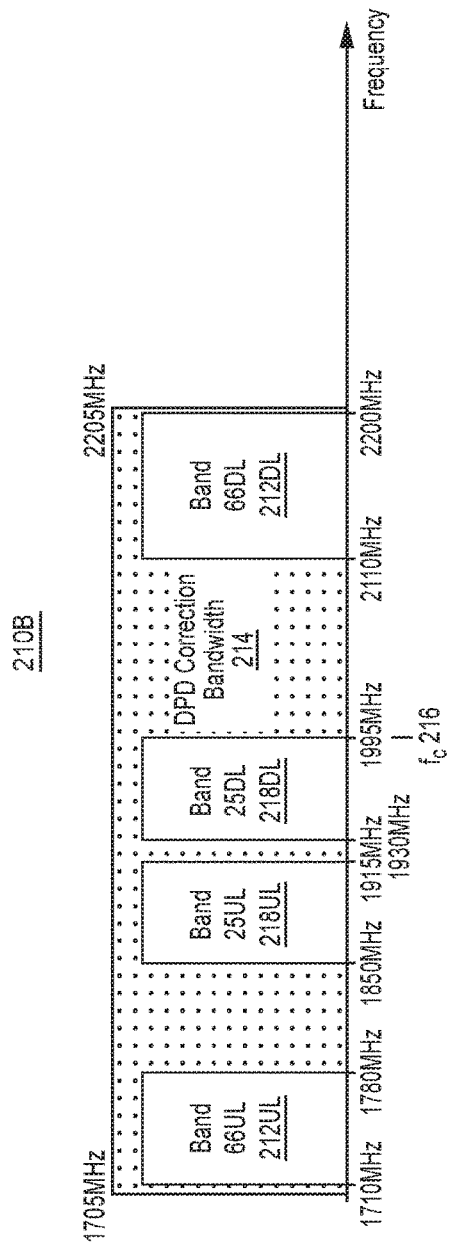
FIG. 2B illustrates another embodiment of a DPD correction bandwidth.

To avoid both costly alternatives, the center frequency of the DPD correction bandwidth 214 can be adjusted. FIG. 2B illustrates another embodiment of a DPD correction bandwidth 210B. In the embodiment, illustrated in FIG. 2B, the DPD correction bandwidth 210B has been adjusted to encompass both DL Band 66 212DL and the complete UL frequency range, i.e. UL Band 66 212UL and the complete UL band 25, without increasing the DPD correction bandwidth 210B. In the illustrated embodiment, this was accomplished by adjusting the center frequency ($f_c$) 216 of the DPD correction bandwidth 210B so that it is centered about the downlink band (DL Band 66 212DL) and the uplink band (UL Band 66 212UL), e.g. at 1955 MHz. This technique may also be referred to as skewing the center frequency of the DPD correction bandwidth 210B. However, for the embodiment illustrated in FIG. 2B, the center frequency 216 need not be centered about the corresponding downlink and uplink bands so long as both bands fall within the DPD correction bandwidth. Although the downlink band is shown as being higher in frequency than the uplink band, the aforementioned technique also applies when the downlink band is lower in frequency than the uplink band. Thus, the center frequency of the DPD correction bandwidth 210B can be skewed higher or lower in frequency depending upon the relative position of the corresponding uplink band and the downlink band.

Skewing of the DPD correction bandwidth 210B can be achieved by reducing the number of (including possibly eliminating) IMD products that are corrected above or below the downlink band, and increasing the number of IMD products that are corrected respectively below or above the downlink band. By adjusting the center frequency of the fixed DPD correction bandwidth 210B, the DPD system 104A diminishes IMD products in the uplink bands of the multiband front end system 100. This skewing technique may be utilized with any of the multiband front end systems 100, 300, 400 illustrated in FIGS. 1, 3 and 4.

Figure 3:
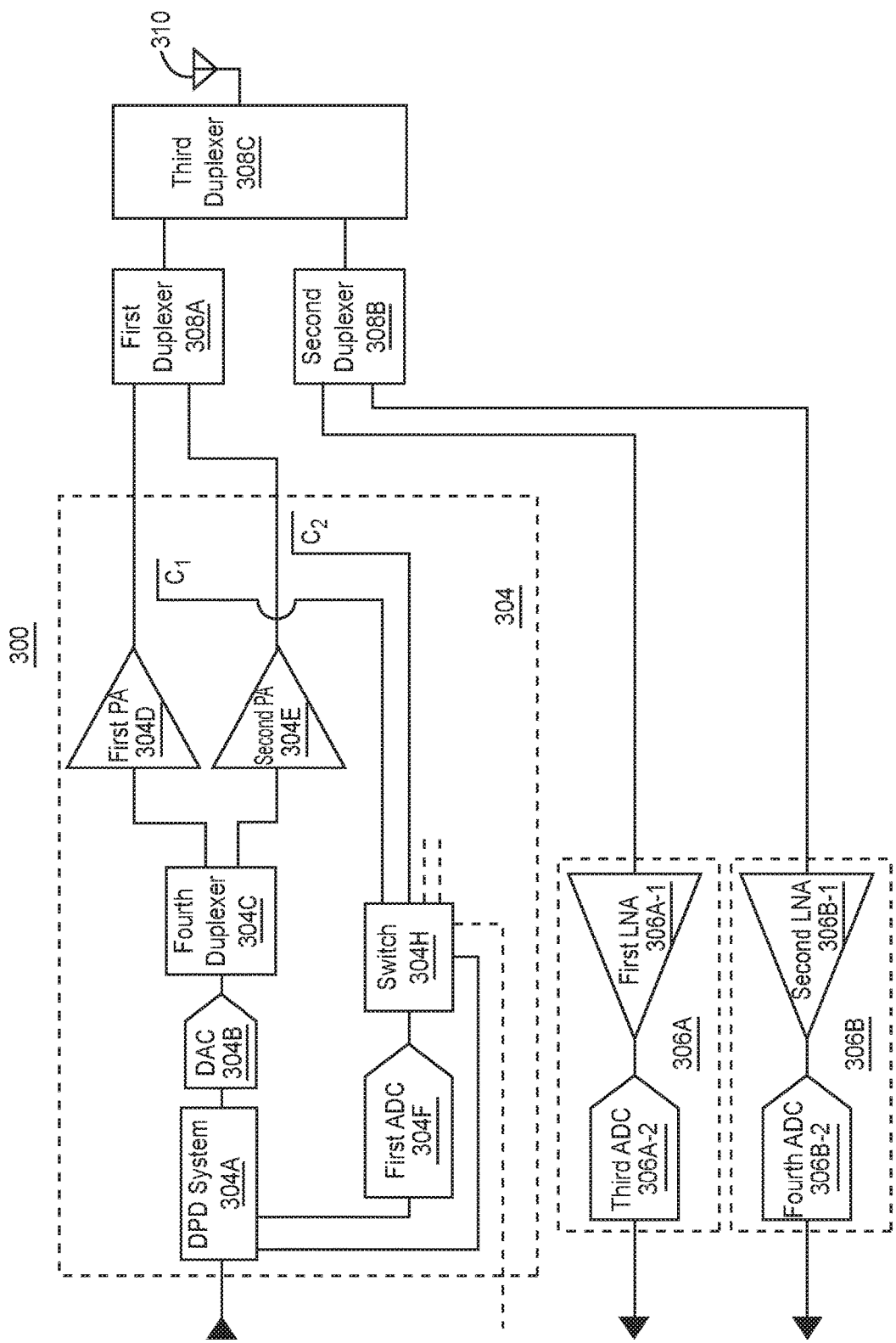
FIG. 3 illustrates a block diagram of another embodiment of a multi-band front end system.

FIG. 3 illustrates a block diagram of another embodiment of a multi-band front end system 300. The multi-band front end system 300 includes fewer analog to digital converters than the multi-band front end system 100 illustrated in FIG. 1.

The implementation and operation of the multi-band front end system 300 illustrated in FIG. 3 is otherwise substantially the same as described for the multi-band front end system 100 illustrated in FIG. 1. Differences between the two systems are described below. The elements in FIG. 3 that are the same as the elements in FIG. 1 have the same figure numbers except that those numbers are preceded by a '3' rather than a '1'.

The transmitter front end system 304 in FIG. 3 differs from the transmitter front end system 104 in FIG. 1 in that it has one less ADC. The third ports of the first coupler C1 and the second coupler C2 are respectively coupled to a first port and a second port of a switch 304H. The common port of the switch 304H is coupled to the input of the first ADC 304F. In one embodiment, the switch 304H is a single pole double throw RF switch. One or more control ports of the switch 304H are coupled to the DPD system 304A (as illustrated) and/or another component of the repeater system. The control port(s) are configured to select an input port of the switch 304H.

The DPD system 304A and/or another component include control logic which causes the switch 304H to periodically alternate providing first and second downlink band signals from respectively the second ports of the first coupler C1 and the second coupler C2 to the common port of the switch 304H, and thus to the input of the first ADC 304F. As a result, the first ADC 304F alternatively digitizes portions of the first and second downlink band signals. In one embodiment, DPD system 304A may include a switch or other processing circuitry to ensure the digitized downlink band signals are provided to corresponding pre-distortion circuitry affecting the downlink band whose signals are being digitized and provided to the DPD system 304A. Thus, the control logic and switch 304H replace the more expensive second ADC 104G used in the multi-band front end system 100 of FIG. 1.

As previously discussed, the transmitter front end system 304 may be designed to process more than two downlink bands. In one embodiment, the switch 304H is a single pole N throw RF switch, where N is the number of switch inputs coupled to the third ports of N couplers.

Figure 4:
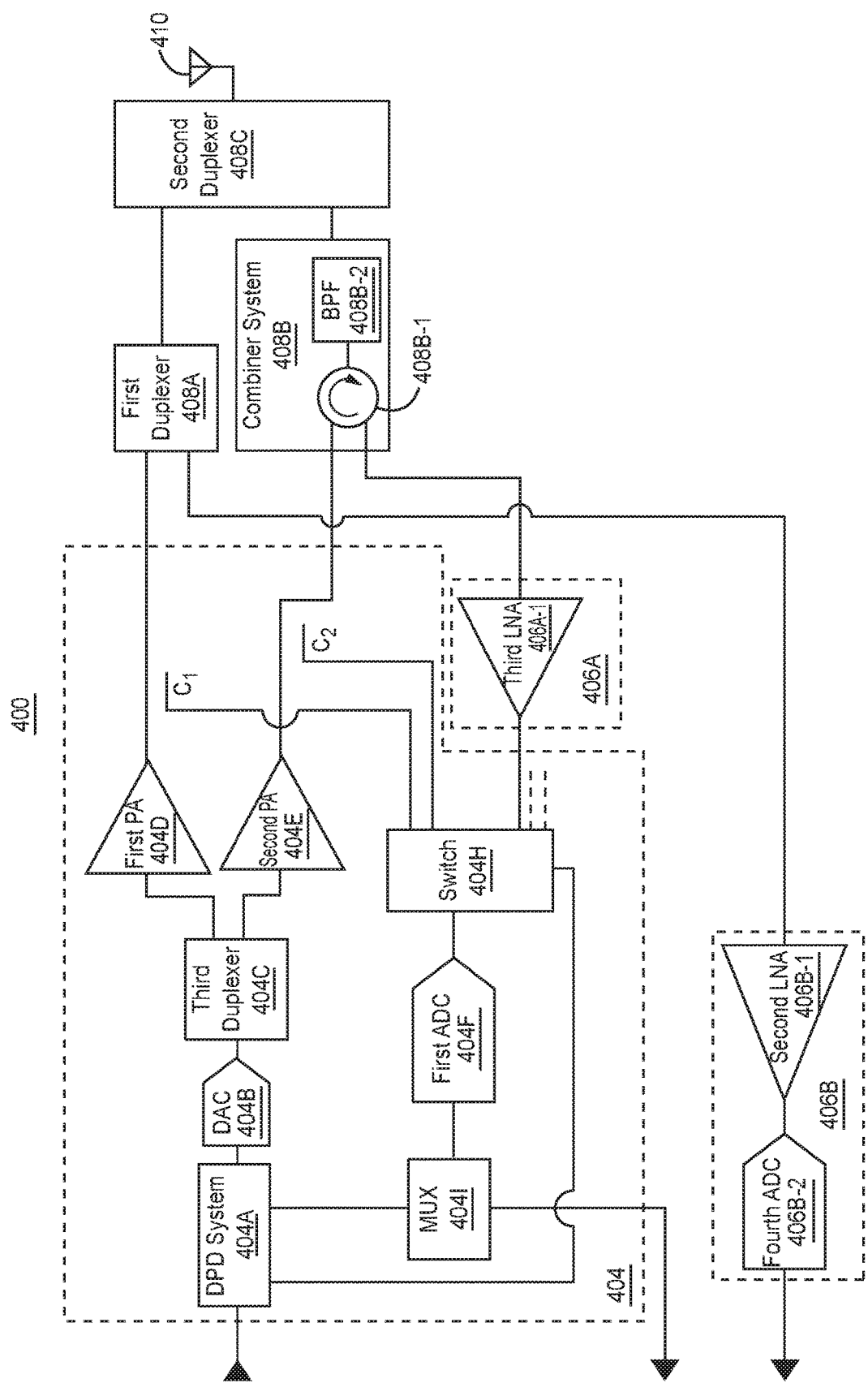
FIG. 4 illustrates a block diagram of a further embodiment of a multi-band front end system.

In one embodiment, a single band, i.e. the same frequency range, may be used for both the downlink and uplink band, and employ time division duplexing (TDD). TDD repeater systems alternatively transmit and receive in the single band. FIG. 4 illustrates a block diagram of a further embodiment of a multi-band front end system 400. The illustrated multi-band front end system 400 utilizes TDD on one band.

A single TDD band is processed by the first power amplifier 404D and the first receiver front end system 406A. Thus, the first receiver front end system 406A includes the third low noise amplifier 406A-1 (but no third ADC), which has an output coupled to a, e.g. third, port of the switch 404H. The aforementioned control logic causes the switch 404H to select the port of the switch 404H coupled to the output of the first receiver front end system 406A when, e.g. the repeater system, is receiving over the single TDD band. Thus, the received TDD signals, provided at the output of the first receiver front end system 406A, are coupled to and digitized by the first ADC 404F. The output of the first ADC 404F is coupled to an input of the DPD system 404A.

In one embodiment, a multiplexer (MUX) 4041 selectively couples the output of the first ADC 404F between an input of the DPD system 404A and an input of another system, e.g. a downconverter. In one embodiment, the multiplexer 4041 is a switch such as a single pole double throw switch. When the repeater system is receiving in the single TDD band, the control logic commands that the multiplexer 4041 couple the output of the first ADC 404F to the input of the other system. Otherwise, the control logic commands the multiplexer 4041 to couple the output of the first ADC 404F to an input of the DPD system 404A configured to receive a portion of the power amplified RF signals in the first and second transmit bands. When transmitter front end 404 transmits over the single TDD band, the control logic causes the switch 404H to periodically alternate providing portions of the power amplified RF signals in the first and second transmit bands (from respectively the third ports of the first coupler C1 and the second coupler C2) to the common port of the switch 404H. The alternating portions are then provided to the input of the first ADC 404F. As a result, the first ADC 404F alternatively digitizes portions of the power amplified RF signals in the first and second transmit bands.

The multi-band front end system 400 also otherwise differs from the multi-band front end systems 100, 300 of FIGS. 1 and 3. The second duplexer 108B, 308B of FIGS. 1 and 3 is replaced by a combiner system 408B. In one embodiment, the combiner system 408B comprises a circulator 408B-1 and a bandpass filter 408B-2. The bandpass filter 408B-2 is designed to only substantially pass signals in the TDD band, and to substantially suppress signals outside of the TDD band.

Further, the first ports of the first coupler C1 and the second coupler C2 are respectively coupled to a first port of a first duplexer 408A and the first port of the combiner system 408B. The inputs of the first receiver front end 406A and the second receiver front end 406B are respectively coupled to the second port of the combiner system 408B and the the second port of the first duplexer 408A. Thus, the combiner system 408B couples the output of the second power amplifier 404E and the input to the first receiver front end 406A; both the second power amplifier 404E and the first receiver front end 406A operate in the TDD band. The third port of the combiner system 408B is coupled to the second duplexer 408C. The duplexer in the transmitter front end 404 is termed the third duplexer 404C.

The implementation and operation of the multi-band front end system 400 illustrated in FIG. 4 is otherwise substantially the same as described for the multi-band front end system 300 illustrated in FIG. 3. Differences between the two systems are described above. The elements in FIG. 4 that are the same as the elements in FIG. 3 have the same figure numbers except that those numbers are preceded by a '4' rather than a '3'.

Figure 5:
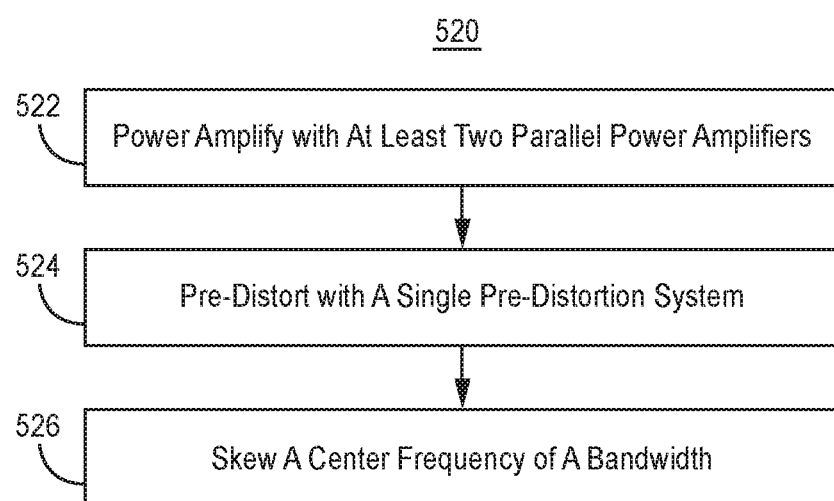
FIG. 5 illustrates one embodiment of a method of operation of a multi-band front end system.

FIG. 5 illustrates one embodiment of a method of operation of a multi-band front end system 520. To the extent that the embodiment of method 520 shown in FIG. 5 is described herein as being implemented in the systems described with respect to FIGS. 1, 3 and 4, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 522, power amplify, with at least two parallel power amplifiers, at least two pre-distorted signals each corresponding to a unique transmit band, wherein each power amplifier operates in a unique transmit band. In one embodiment, the power amplified, pre-distorted signals are broadcast.

In block 524, pre-distort, with a single pre-distortion system, at least two signals in different frequency bands, where the pre-distortion of each of the at least two signals is based upon a portion of a corresponding of power amplified, pre-distorted signal, and where the pre-distortion diminishes certain IMD products in the corresponding power amplified, pre-distorted signal. The signals to be pre-distorted may be digital baseband or digitized RF signals. If the signals are digital baseband data, then, in one embodiment, also up convert the pre-distorted signals prior to power amplification, and down convert the portions of the power amplified, pre-distorted signals prior to utilizing them for pre-distortion. If the signals are digitized RF signals rather than digital baseband signals, then, in another embodiment, convert the digitized RF signals to analog signals prior to power amplification, and digitize the portions of each of the power amplified, pre-distorted signals prior to utilizing them for pre-distortion. In a further embodiment, selectively digitize, with a single ADC, the portions of each of the power amplified, pre-distorted signals prior to utilizing them for pre-distortion. In yet another embodiment, selectively digitize, with the single analog to digital converter, a received signal during a time period for reception.

In one embodiment, in block 526, skew a center frequency of a bandwidth in which pre-distortion is performed and which corresponds to one transmit band so that the pre-distortion bandwidth covers corresponding uplink and downlink (i.e. transmit) bands. In another embodiment, skew the center frequency so that the center frequency is equidistant from the center frequencies corresponding to the downlink band, and its corresponding uplink band.

The DPD techniques and features described above can be implemented in various types of systems. For example, the DPD techniques and features described above can be implemented in various types of repeater systems. Repeater systems can be implemented in various ways.

For example, a repeater system can be implemented as a distributed antenna system (DAS). FIG. 6A illustrates one embodiment of a distributed antenna system 600 in which the DPD techniques described above can be implemented.

The DAS 600 comprises one or more master units 602 that are communicatively coupled to one or more remote antenna units (RAUs) 604 via one or more waveguides 606, e.g. optical fibers or cables. Each remote antenna unit 604 can be communicatively coupled directly to one or more of the master units 602 or indirectly via one or more other remote antenna units 604 and/or via one or more expansion (or other intermediary) unit 608.

The DAS 600 is coupled to one or more base stations 603 and is configured to improve the wireless coverage provided by the base stations 603.

The capacity of each base station can be dedicated to the DAS or can be shared among the DAS and a base station antenna system that is co-located with the base station and/or one or more other repeater systems.

In the embodiment shown in FIG. 6A, the capacity of one or more base stations 603 are dedicated to the DAS 600 and are co-located with the DAS 600. The base stations 603 are coupled to the DAS 600. It is to be understood however that other embodiments can be implemented in other ways. For example, the capacity of one or more base stations 603 can be shared with the DAS 600 and a base station antenna system co-located with the base stations 603 (for example, using a donor antenna).

The base stations 603 can include one or more base stations that are used to provide commercial cellular wireless service and/or one or more base stations that are used to provide public and/or private safety wireless services (for example, wireless communications used by emergency services organizations (such as police, fire and emergency medical services) to prevent or respond to incidents that harm or endanger persons or property).

The base stations 603 can be coupled to the master units 602 using a network of attenuators, combiners, splitters, amplifiers, filters, cross-connects, etc., (sometimes referred to collectively as a "point-of-interface" or "POI"). This network can be included in the master units 602 and/or can be separate from the master units 602. This is done so that, in the downlink, the desired set of RF channels output by the base stations 603 can be extracted, combined, and routed to the appropriate master units 602, and so that, in the upstream, the desired set of carriers output by the master units 602 can be extracted, combined, and routed to the appropriate interface of each base station 603. It is to be understood, however, that this is one example and that other embodiments can be implemented in other ways.

In general, each master unit 602 comprises downlink DAS circuitry 610 that is configured to receive one or more downlink signals from one or more base stations 603. Each base station downlink signal includes one or more radio frequency channels used for communicating in the downlink direction with user equipment 614 over the relevant wireless air interface. Typically, each base station downlink signal is received as an analog radio frequency signal, though in some embodiments one or more of the base station signals are received in a digital form (for example, in a digital baseband form complying with the Common Public Radio Interface ("CPR") protocol, Open Radio Equipment Interface ("ORP") protocol, the Open Base Station Standard Initiative ("OBSAI") protocol, or other protocol).

The downlink DAS circuitry 610 in each master unit 602 is also configured to generate one or more downlink transport signals derived from one or more base station downlink signals and to transmit one or more downlink transport signals to one or more of the remote antenna units 604.

FIG. 6B illustrates one embodiment of a remote antenna unit in which digital pre-distortion techniques described above can be implemented. Each remote antenna unit 604 comprises downlink DAS circuitry 612 that is configured to receive the downlink transport signals transmitted to it from one or more master units 602 and to use the received downlink transport signals to generate one or more downlink radio frequency signals that are radiated from one or more antennas 615 associated with that remote antenna unit 604 for reception by user equipment 614. In this way, the DAS 600 increases the coverage area for the downlink capacity provided by the base stations 603. The downlink DAS circuitry 612 of each RAU 604 includes at least one transmitter front end (TX FE) 619 which, for example, power amplifies the downlink radio frequency signals.

Also, each remote antenna unit 604 comprises uplink DAS circuitry 617 that is configured to receive one or more uplink radio frequency signals transmitted from the user equipment 614. These signals are analog radio frequency signals.

The uplink DAS circuitry 617 in each remote antenna unit 604 is also configured to generate one or more uplink transport signals derived from the one or more remote uplink radio frequency signals and to transmit one or more uplink transport signals to one or more of the master units 602. The uplink DAS circuitry 617 of each RAU 604 includes at least one receiver front end (RX FE) 622 which, e.g. amplifies received remote uplink radio frequency signals.

Returning to FIG. 6A, each master unit 602 comprises uplink DAS circuitry 616 that is configured to receive the respective uplink transport signals transmitted to it from one or more remote antenna units 604 and to use the received uplink transport signals to generate one or more base station uplink radio frequency signals that are provided to the one or more base stations 603 associated with that master unit 602. Typically, this involves, among other things, combining or summing uplink signals received from multiple remote antenna units 604 in order to produce the base station signal provided to each base station 603. In this way, the DAS 600 increases the coverage area for the uplink capacity provided by the base stations 603.

Each expansion unit 608 comprises downlink DAS circuitry (D/L DAS circuitry) 618 that is configured to receive the downlink transport signals transmitted to it from the master unit 602 (or other expansion unit 608) and transmits the downlink transport signals to one or more remote antenna units 604 or other downstream expansion units 608. Each expansion unit 608 also comprises uplink DAS circuitry 620 that is configured to receive the respective uplink transport signals transmitted to it from one or more remote antenna units 604 or other downstream expansion units 608, combine or sum the received uplink transport signals, and transmit the combined uplink transport signals upstream to the master unit 602 or other expansion unit 608. In other embodiments, one or more remote antenna units 604 are coupled to one or more master units 602 via one or more other remote antenna units 604 (for example, where the remote antenna units 604 are coupled together in a daisy chain or ring topology).

The downlink DAS circuitry (D/L DAS circuitry) 610, 612, and 618 and uplink DAS circuitry (U/L DAS circuitry) 616, 617, and 620 in each master unit 602, remote antenna unit 604, and expansion unit 608, respectively, can comprise one or more appropriate connectors, attenuators, combiners, splitters, amplifiers, filters, duplexers, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink DAS circuitry 610, 612, and 618 and uplink DAS circuitry 616, 617, and 620 may share common circuitry and/or components.

The DAS 600 can use either digital transport, analog transport, or combinations of digital and analog transport for generating and communicating the transport signals between the master units 602, the remote antenna units 604, and any expansion units 608. Each master unit 602, remote antenna unit 604, and expansion unit 608 in the DAS 600 also comprises a respective controller (CNTRL) 621. The controller 621 is implemented using one or more programmable processors that execute software that is configured to implement the various control functions. The controller 621 (more specifically, the various control functions implemented by the controller 621) (or portions thereof) can be implemented in other ways (for example, in a field programmable gate array (FPGA), application specific integrated circuit (ASIC), etc.). The DPD system 404A and/or control logic described above may be incorporated in, e.g. the controller 621 of a remote antenna unit 604 or in another controller 621 or state machine incorporated into the distributed antenna system 600.

The at least one transmitter front end 619 includes at least one of the transmitter front ends 104, 304, 404 described above. The at least one receiver front end 622 includes at least one, e.g. two, of the corresponding receiver front ends 106A, 106B, 306A, 306B, 406A, 406B described above. Further, as discussed above, a combination of two or more duplexers and/or one or more duplexers and one or more combiner systems can be used to couple the at least one transmitter front end 619 and the at least one receiver front end 622 to one or more antennas 615. The DPD system 104A, 304A, 404A and/or control logic may be incorporated, e.g. in the controller 621 of a remote antenna unit 604 or in another controller 621 otherwise incorporated into the distributed antenna system 600.

Repeater systems can be implemented in other ways. For example, a repeater system can be implemented as a single-node repeater. FIG. 7 illustrates one embodiment of a single-node repeater 700 in which the DPD techniques described above can be implemented.

The single-node repeater 700 comprises downlink repeater circuitry 712 that is configured to receive one or more downlink signals from one or more base stations 703. These signals are also referred to here as "base station downlink signals." Each base station downlink signal includes one or more radio frequency channels used for communicating in the downlink direction with user equipment (UE) 714 over the relevant wireless air interface. Typically, each base station downlink signal is received as an analog radio frequency signal.

The downlink repeater circuitry 712 in the single-node repeater 700 is also configured to generate one or more downlink radio frequency signals that are radiated from one or more antennas 715 associated with the single-node repeater 700 for reception by user equipment 714. These downlink radio frequency signals are analog radio frequency signals and are also referred to here as "repeated downlink radio frequency signals." Each repeated downlink radio frequency signal includes one or more of the downlink radio frequency channels used for communicating with user equipment 714 over the wireless air interface. In this exemplary embodiment, the single-node repeater 700 is an active repeater system in which the downlink repeater circuitry 712 comprises one or more amplifiers (or other gain elements) that are used to control and adjust the gain of the repeated downlink radio frequency signals radiated from the one or more antennas 715. The downlink repeater circuitry 712 includes at least one transmitter front end (TX FE) 719 which, for example, power amplifies the repeated downlink radio frequency signals.

Also, the single-node repeater 700 comprises uplink repeater circuitry 720 that is configured to receive one or more uplink radio frequency signals transmitted from the user equipment 714. These signals are analog radio frequency signals and are also referred to here as "UE uplink radio frequency signals." Each UE uplink radio frequency signal includes one or more radio frequency channels used for communicating in the uplink direction with user equipment 714 over the relevant wireless air interface.

The uplink repeater circuitry 720 in the single-node repeater 700 is also configured to generate one or more uplink radio frequency signals that are provided to the one or more base stations 703. These signals are also referred to here as "repeated uplink signals." Each repeated uplink signal includes one or more of the uplink radio frequency channels used for communicating with user equipment 714 over the wireless air interface. In this exemplary embodiment, the single-node repeater 700 is an active repeater system in which the uplink repeater circuitry 720 comprises one or more amplifiers (or other gain elements) that are used to control and adjust the gain of the repeated uplink radio frequency signals provided to the one or more base stations 703. Typically, each repeated uplink signal is provided to the one or more base stations 703 as an analog radio frequency signal. The uplink repeater circuitry 720 includes at least one receiver front end (RX FE) 722 which, e.g., amplifies received uplink radio frequency signals.

The downlink repeater circuitry 712 and uplink repeater circuitry 720 can comprise one or more appropriate connectors, attenuators, combiners, splitters, amplifiers, filters, duplexers, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink repeater circuitry 712 and uplink repeater circuitry 720 may share common circuitry and/or components.

The at least one transmitter front end 719 includes at least one of the transmitter front ends 104, 304, 404 described above. The at least one receiver front end 722 includes at least one, e.g. two, of the corresponding receiver front ends 106A, 106B, 306A, 306B, 406A, 406B described above. Further a combination of two or more duplexers can be used to couple the at least one transmitter front end 719 and the at least one receiver front end 722 to one or more antennas 715. The single-node repeater system 700 also comprises a controller (CNTRL) 721. The controller 721 is implemented using one or more programmable processors that execute software that is configured to implement the various control functions. The controller 721 (more specifically, the various control functions implemented by the controller 721) (or portions thereof) can be implemented in other ways (for example, in a field programmable gate array (FPGA), application specific integrated circuit (ASIC), etc.). The DPD system 104A, 304A, 404A and/or control logic may be incorporated, e.g. in the controller 721 of the single-node repeater system 700.

EXAMPLE EMBODIMENTS

Example 1 includes a system, comprising: a digital pre-distortion (DPD) system having an input configured to receive signals corresponding to at least two transmit bands, and an output; a digital to analog converter having an input coupled to the output of the DPD system, and an output; a first multiplexer comprising a first port, a second port, and a third port, where the first port is coupled to the output of the digital to analog converter; a first power amplifier having an input coupled to the second port of the first multiplexer, an output, and is configured to power amplify signals in a first transmit band; a second power amplifier having an input coupled to the third port of the first multiplexer, an output, and is configured to power amplify signals in a second transmit band; a first coupler having a first port, a second port and a third port, where the first port is coupled to the output of the first power amplifier; a second coupler having a first port, a second port and a third port, where the first port is coupled to the output of the second power amplifier; a first analog to digital converter having an input coupled to the second port of the first coupler, and an output coupled to the DPD system; and a second analog to digital converter having an input coupled to the second port of the second coupler, and an output coupled to the DPD system.

Example 2 includes the system of Example 1, wherein if the signals are digital baseband data, then the digital to analog converter comprises an up converter, and each of the first and second analog to digital converters comprise a down converter.

Example 3 includes the system of any of Examples 1-2, further comprising: a first receiver front end system having an input and an output; and a second receiver front end system having an input and an output.

Example 4 includes the system of Example 3, further comprising: a second multiplexer having a first port, a second port, and a third port, where the first port is coupled to the third port of the first coupler and the second port is coupled to the third of the second coupler; a third multiplexer having a first port, a second port, and a third port, where the first port is coupled to an input of the first receiver front end system and the second port is coupled to an input of the second receiver front end system; a fourth multiplexer having a first port, a second port, and a third port, where the first port is coupled to the third port of the second multiplexer and the second port is coupled to the third port of the third multiplexer; and an antenna coupled to the third port of the fourth multiplexer.

Example 5 includes the system of any of Examples 1-4, wherein the DPD system is configured to skew a center frequency of a bandwidth in which pre-distortion is performed and corresponding to one of the at least two transmit bands so that a pre-distortion bandwidth covers corresponding uplink and downlink bands.

Example 6 includes the system of Example 5, wherein the center frequency is equidistant from the center frequencies corresponding to the downlink band, and its corresponding uplink band.

Example 7 includes a system, comprising: a digital pre-distortion (DPD) system having an input configured to receive signals corresponding to at least two transmit bands, and an output; a digital to analog converter having an input coupled to the output of the DPD system, and an output; a first multiplexer comprising a first port, a second port, and a third port, where the first port is coupled to the output of the digital to analog converter; a first power amplifier having an input coupled to the second port of the multiplexer, an output, and is configured to power amplify signals in a first transmit band; a second power amplifier having an input coupled to the third port of the multiplexer, an output, and is configured to power amplify signals in a second transmit band; a first coupler having a first port, a second port and a third port, where the first port is coupled to the output of the first power amplifier; a second coupler having a first port, a second port and a third port, where the first port is coupled to the output of the second power amplifier; a switch having a first input port coupled to the second port of the first coupler, a second input port coupled to the second port of the second coupler, a common port, and at least one control port configured to select an input port of the switch; and an analog to digital converter having an input coupled to the common port of the switch, and an output coupled to the DPD system.

Example 8 includes the system of Example 7, wherein if the signals are digital baseband data, then the digital to analog converter comprises an up converter, and the analog to digital converter comprises a down converter.

Example 9 includes the system of any of Examples 7-8, further comprising: a first receiver front end system having an input and an output; and a second receiver front end system having an input and an output.

Example 10 includes the system of Example 9, further comprising: a second multiplexer having a first port, a second port, and a third port, where the first port is coupled to the third port of the first coupler and the second port is coupled to the third of the second coupler; a third multiplexer having a first port, a second port, and a third port, where the first port is coupled to an input of the first receiver front end system and the second port is coupled to an input of the second receiver front end system; a fourth multiplexer having a first port, a second port, and a third port, where the first port is coupled to the third port of the second multiplexer and the second port is coupled to the third port of the third multiplexer; and an antenna coupled to the third port of the fourth multiplexer.

Example 11 includes the system of any of Examples 7-10, wherein the switch has a third port; and the system further comprises: a first receiver front end system having an input and an output, where the output is coupled to the third port of the switch; and a second receiver front end system having an input and an output.

Example 12 includes the system of Example 11, further comprising a multiplexer having an input, a first output, a second output, and at least one control input, where the input is coupled to the output of the analog to digital converter, the first output is coupled to the DPD system.

Example 13 includes the system of any of Examples 11-12, comprising: a second multiplexer having a first port, a second port, and a third port, where the first port is coupled to the third port of the first coupler and an input of a second receiver front end system; a combiner system having a first port, a second port, and a third port, where the first port is coupled to an input of the first receiver front end system and the second port is coupled to the third of the second coupler; a third multiplexer having a first port, a second port, and a third port, where the first port is coupled to the third port of the second multiplexer and the second port is coupled to the third port of the combiner system; and an antenna coupled to the third port of the fourth multiplexer.

Example 14 includes the system of Example 13, wherein the combiner system comprises: a circulator; and a bandpass filter coupled to the circulator.

Example 15 includes the system of any of Examples 7-14, wherein the DPD system is configured to skew a center frequency of a bandwidth in which pre-distortion is performed and corresponding to one of the at least two transmit bands so that a pre-distortion bandwidth covers corresponding uplink and downlink bands.

Example 16 includes the system of any of Examples 7-15, wherein the center frequency is equidistant from the center frequencies corresponding to the downlink band, and its corresponding uplink band.

Example 17 includes a method, comprising: power amplifying, with at least two parallel power amplifiers, at least two pre-distorted signals each corresponding to a unique transmit band, wherein each power amplifier operates in a unique transmit band; and pre-distorting, with a single pre-distortion system, at least two signals in different transmit bands, where the pre-distortion of each of the at least two signals is based upon a portion of a corresponding power amplified, pre-distorted signal, and where the pre-distortion diminishes certain IMD products in the corresponding power amplified, pre-distorted signal.

Example 18 includes the method of any of Examples 15-17, wherein if the at least two signals are digital baseband data, then up converting the pre-distorted signals prior to power amplification, and down converting the portions of the power amplified, pre-distorted signals prior to utilizing the portions of the power amplified, pre-distorted signals for pre-distortion.

Example 19 includes the method of any of Examples 15-18, wherein if the pre-distorted signals, prior to power amplification, are digital signals, then converting the digital signals to analog signals prior to power amplification, and digitizing the portions of each of the power amplified, pre-distorted signals prior to utilizing them for pre-distortion.

Example 20 includes the method of any of Examples 17-19, wherein digitizing the portions comprises selectively digitizing, with a single analog to digital converter, the portions of each of the power amplified, pre-distorted signals prior to utilizing them for pre-distortion.

Example 21 includes the method of any of Examples 18-20, wherein selectively digitizing, with the single analog to digital converter, further comprises, where a unique transmit band is used for time division duplexing, selectively digitizing, with the single ADC, a received signal during a time period for reception.

Example 22 includes the method of any of Examples 17-21, further comprising skewing a center frequency of a bandwidth in which pre-distortion is performed and which corresponds to one transmit band so that the pre-distortion bandwidth covers corresponding uplink and downlink bands.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims. For example, a signal may be a voltage signal or a current signal.

The invention claimed is:
1. A system, comprising:
pre-distortion circuitry comprising an output;
wherein the predistortion circuitry is configured to pre-distort at least two signals in different transmit bands;
a digital to analog converter comprising an input coupled to the output of the pre-distortion circuitry, and an output;
wherein the predistortion circuitry is further configured to skew a center frequency of a bandwidth in which pre-distortion is performed and which corresponds to one transmit band so that the pre-distortion bandwidth covers corresponding uplink and downlink bands;
wherein the pre-distortion of each of the at least two signals is based upon a portion of a corresponding power amplified, pre-distorted signal, and where the pre-distortion diminishes certain intermodulation distortion (IMD) products in each of the power amplified, pre-distorted signals;
at least two power amplifier circuits, wherein each power amplifier circuit comprises an input and an output, and is configured to operate in a unique transmit band;
wherein each input of each power amplifier circuit is coupled in parallel to the output of the digital to analog converter;
wherein each output of each power amplifier circuit is coupled in parallel; and
wherein the at least two power amplifier circuits are configured to power amplify at least two pre-distorted signals each corresponding to a unique transmit band.

2. The system of claim 1, wherein the skewed center frequency is equidistant from center frequencies corresponding to the downlink band, and its corresponding uplink band.

3. The system of claim 1, further comprising a first duplexer comprising a first port, a second port, and a third port, where the first port of the first duplexer is coupled to the output of the digital to analog converter, the second port of the first duplexer is coupled to an input of a first power amplifier circuit, and the third port is coupled to an input of a second power amplifier circuit.

4. The system of claim 3, further comprising:
a first coupler comprising a first port, a second port and a third port, where the first port of the first coupler is coupled to the output of the first power amplifier circuit; and
a second coupler comprising a first port, a second port and a third port, where the first port of the second coupler is coupled to the output of the second power amplifier circuit.

5. The system of claim 1, further comprising:
at least one analog to digital converter coupled between outputs of each of the power amplifier circuits, and the DPD circuitry.

6. The system of claim 5, wherein the at least two signals are digital baseband data, the digital to analog converter comprises an up converter, and the at least one analog to digital converter comprises a down converter.

7. The system of claim 1, further comprising:
a first receiver front end system comprising an input and an output; and
a second receiver front end system comprising an input and an output.

8. The system of claim 7, further comprising:
a first coupler comprising a first port, a second port and a third port, where the first port of the first coupler is coupled to the output of a first power amplifier circuit;
a second coupler comprising a first port, a second port and a third port, where the first port of the second coupler is coupled to the output of a second power amplifier circuit;
a second duplexer comprising a first port, a second port, and a third port, where the first port of the second duplexer is coupled to the third port of the first coupler and the second port of the second duplexer is coupled to the third port of the second coupler;
a third duplexer comprising a first port, a second port, and a third port, where the first port of the third duplexer is coupled to an input of the first receiver front end system and the second port of the third duplexer is coupled to an input of the second receiver front end system;
a fourth duplexer comprising a first port, a second port, and a third port, where the first port of the fourth duplexer is coupled to the third port of the second duplexer and the second port of the fourth duplexer is coupled to the third port of the third duplexer; and
wherein the third port of the fourth duplexer is configured to be coupled to an antenna.

9. The system of claim 1, wherein the transmit band is also the receive band, and the system is configured to be used for time division duplexing.

* * * * *